(12) United States Patent
Kouchiyama et al.

(10) Patent No.: US 7,560,220 B2
(45) Date of Patent: *Jul. 14, 2009

(54) RESIST MATERIAL AND NANOFABRICATION METHOD

(75) Inventors: Akira Kouchiyama, Kanagawa (JP); Katsuhisa Aratani, Chiba (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/077,119

(22) Filed: Mar. 17, 2008

(65) Prior Publication Data

US 2008/0171290 A1    Jul. 17, 2008

Related U.S. Application Data

(63) Continuation of application No. 11/430,158, filed on May 8, 2006, now Pat. No. 7,344,822, which is a continuation of application No. 10/474,852, filed as application No. PCT/JP03/01886 on Feb. 20, 2003, now Pat. No. 7,175,962.

(30) Foreign Application Priority Data

Feb. 22, 2002  (JP)  ............................. 2002-046029
Oct. 10, 2002  (JP)  ............................. 2002-297893

(51) Int. Cl.
  *G03F 7/00*   (2006.01)
  *G03F 7/004*  (2006.01)

(52) U.S. Cl. ................................. 430/270.1; 430/311

(58) Field of Classification Search .............. 430/270.1, 430/311
See application file for complete search history.

(56) References Cited

U.S. PATENT DOCUMENTS 3,895,234  A    7/1975  O'Keefe et al.

FOREIGN PATENT DOCUMENTS

| JP | 55-017152 | 2/1980 |
| JP | 56-125743 | 10/1981 |
| JP | 03-110563 | 5/1991 |
| JP | 03-129349 | 6/1991 |
| JP | 06-132188 | 5/1994 |
| JP | 09-104182 | 4/1997 |
| JP | 11-209558 | 8/1999 |
| KR | 401763 | 10/2003 |

*Primary Examiner*—Amanda C. Walke
(74) *Attorney, Agent, or Firm*—Robert J. Depke; Rockey, Depke & Lyons, LLC

(57) ABSTRACT

A resist material and a nanofabrication method provide high-resolution nanofabrication without an expensive irradiation apparatus using, for example, electron beams or ion beams. That is, the resist material and the nanofabrication method provide finer processing using exposure apparatuses currently in use. A resist layer of an incompletely oxidized transition metal such as W and Mo is selectively exposed and developed to be patterned in a predetermined form. The incompletely oxidized transition metal herein is a compound having an oxygen content slightly deviated to a lower content from the stoichiometric oxygen content corresponding to a possible valence of the transition metal. In other words, the compound has an oxygen content lower than the stoichiometric oxygen content corresponding to a possible valence of the transition metal.

19 Claims, 8 Drawing Sheets

RESIST MATERIAL AND NANOFABRICATION METHOD

The subject matter of application Ser. No. 11/430,158, is incorporated herein by reference. The present application is a continuation of U.S. application Ser. No. 11/430,158, filed May 8, 2006 now U.S. Pat. No. 7,344,822, which is a continuation of U.S. application Ser. No. 10/474,852 filed Mar. 22, 2004 now U.S. Pat. No. 7,175,962, which is a 371 U.S. National Stage filing of PCT application No. PCT/JP03/01886 filed Feb. 20, 2003, which claims priority to Japanese Patent Application No. JP2002-297893, filed Oct. 10, 2002 and Japanese Patent Application No. JP2002-046029, filed Feb. 22, 2002. The present application claims priority to these previously filed applications.

TECHNICAL FIELD

The present invention relates to inorganic resist materials and nanofabrication methods with the resist materials and, particularly, to a resist material and a nanofabrication method allowing high-precision nanofabrication with an exposure source over ultraviolet to visible light region.

BACKGROUND ART

The latest lithography for nanofabrication in, for example, semiconductors, optical devices, and magnetic devices requires patterning precision on the order of tens of nanometers or less. To achieve such high-precision patterning, intensive development has been made in various fields such as light sources, resist materials, and steppers.

Effective approaches to enhance the dimensional precision of nanofabrication include use of shorter wavelengths and convergent electron or ion beams in an exposure source. However, short-wavelength exposure sources and convergent electron or ion beam irradiation sources are so expensive that these sources are unsuitable for providing less expensive devices.

To enhance the dimensional precision of machining with the same exposure source as that in exposure apparatuses currently in use, other approaches have been proposed such as improvements in illumination methods and use of a special mask referred to as a phase shift mask. Further approaches have been attempted which include methods with a multilayer resist or an inorganic resist.

An exposure method has generally been employed which involves organic resists such as novolac resists and chemically amplified resists with ultraviolet light as an exposure source. Organic resists, which are versatile, have extensively been used in the field of lithography. However, their large molecular weight results in an unclear pattern at the boundary between exposed and unexposed areas. This is disadvantageous from the viewpoint of enhancing the precision of nanofabrication.

In contrast, inorganic resists, which have a low molecular weight, provide a clear pattern at the boundary between exposed and unexposed areas, and have the possibility of achieving high-precision nanofabrication compared to organic resists. For example, Jpn. J. Appl. Phys., Vol. 30 (1991), p. 3246 introduces a nanofabrication method with, for example, $MoO_3$ or $WO_3$ as a resist material and ion beams as an exposure source; and Jpn. J. Appl. Phys., Vol. 35 (1996), p. 6673 introduces a method with $SiO_2$ as a resist material and electron beams as an exposure source. Furthermore, SPIE, Vol. 3424 (1998), p. 20 introduces a method with chalcogenide glass as a resist material and 476 and 532 nm lasers and ultraviolet light from a mercury-xenon lamp as exposure sources.

The use of electron beams as an exposure source can be combined with many kinds of inorganic resist materials, as described above, while only chalcogenide has been reported as a material corresponding to ultraviolet or visible light. The reason is that inorganic resist materials proposed other than chalcogenide that are transparent to ultraviolet or visible light have significantly low absorbance, which is unsuitable for practical use.

Chalcogenide has the advantage of allowing ultraviolet or visible light and therefore exposure apparatuses currently in use, but has the problem of containing some agents harmful to humans, such as $Ag_2S_3$, $Ag$—$As_2S_3$, and $Ag_2Se$—$GeSe$.

On the other hand, photolithography with ultraviolet or visible light are extensively applied to the manufacture of various devices such as semiconductor devices, such as dynamic random access memory (DRAM), flash memory, central processing units (CPUs), and application specific ICs (ASICs); magnetic devices, such as magnetic heads; displays, such as liquid crystal displays, electroluminescent (EL) displays, and plasma display panels (PDPs); optical devices, such as optical recording media and optical modulation elements. Examples of these devices are compact discs (CD, which is a registered trademark), which are read-only optical discs as typified by DVDs. The structure of an optical disc will be described below.

An optical disc essentially includes an optically transparent substrate of, for example, polycarbonate, which has a main surface with a fine irregular pattern of, for example, pits and grooves representing information signals. The main surface is covered with a thin reflective film of a metal such as aluminum, which is further covered with a protective film.

Such a fine irregular pattern on the optical disc is formed with a stamper having a high-precision fine irregular pattern through a process of transferring the pattern onto the substrate faithfully and readily. A method for preparing the stamper will be described below.

For example, a glass substrate with a sufficiently smooth surface is disposed on a rotating platform. A photoresist, which is photosensitive, is applied onto the glass substrate rotating at a predetermined rotational speed. The rotation spreads the photoresist over the glass substrate, so that the glass substrate is entirely spin-coated. The photoresist is exposed to recording laser light in a predetermined pattern to form a latent image corresponding to information signals. The photoresist is then developed with a developer to remove an exposed or unexposed area, thereby providing a resist master with the predetermined irregular pattern of the photoresist. Metal is further deposited on the irregular pattern of the resist master by a process such as electroplating to transfer the irregular pattern to the metal. The metal, which is a stamper, is separated from the resist master.

The stamper is used to duplicate a large number of substrates made of thermoplastic resin, such as polycarbonate, by known transferring processes such as injection molding. Each of the substrates is then covered with, for example, a reflective film and a protective film to complete an optical disc.

The capacity of information recordable on the optical disc depends on the density of pits or grooves that can be formed. In other words, the capacity of information recordable on the optical disc depends on the fineness of the irregular pattern formed by cutting, namely, exposing a resist layer to laser light to form a latent image.

For example, a stamper for read-only DVDs (DVD-ROMs) has a spiral pit string with a minimum pit length of 0.4 µm and a track pitch of 0.74 μm. An optical disc 12 cm in diameter, produced with a stamper as a mold, has an information capacity of 4.7 GB per side.

Production of optical discs with such a structure requires a resist master prepared by a lithography process using a laser with a wavelength of 413 nm and an objective lens with a numerical aperture (NA) of approximately 0.90 (for example, 0.95).

With the current rapid progress in information and communication technology and image-processing technology, optical discs as described above are facing the task of achieving a recording capacity several times higher than the current capacity. For example, next-generation optical discs with a diameter of 12 cm, an extension of digital videodiscs, are required to attain an information capacity of 25 GB per side by conventional signal processing. To meet this requirement, the minimum pit length and track pitch of the optical discs must be reduced to approximately 0.17 μm and 0.32 μm, respectively.

The minimum pit length P (μm) in exposure is represented by equation (1) below:

$$P = K \cdot \lambda / NA \quad (1)$$

where $\lambda$ (μm) represents the wavelength of the light source; NA represents the numerical aperture of the objective lens; and K represents a proportional constant.

The wavelength $\lambda$ of a light source and the numerical aperture NA of an objective lens are parameters depending on the specification of a laser apparatus. The proportional constant K is a parameter depending on a combination of the laser apparatus and the resist layer.

In the production of the above optical discs, such as DVDs, setting the wavelength to 0.413 μm and the numerical aperture NA to 0.90 leads to a minimum pit length of 0.40 μm, then providing a proportional constant K of 0.87 from equation (1) above.

In general, a shorter laser wavelength is effective to achieve the fine pit described above. That is, in the case of the same proportional constant K and, for example, NA=0.95, a light source with a laser wavelength $\lambda$ of 0.18 μm is required to provide the minimum pit length of approximately 0.17 μm, which is necessary for high-density optical discs with a recording capacity of 25 GB per side.

The wavelength of 0.18 μm required in this case is shorter than a wavelength of 193 nm of an ArF laser, which is being developed as a light source for next-generation semiconductor lithography. An exposure apparatus achieving such a short wavelength requires special optical components, such as the lens, as well as a special laser as a light source, thus becoming extremely expensive. In increasing the optical resolution to address nanofabrication, an approach based on a shorter exposure wavelength $\lambda$ and a larger numerical aperture NA is quite unsuitable for production of inexpensive devices due to the following reason: this approach inevitably requires the replacement of the exposure apparatuses currently in use with expensive exposure apparatuses because the exposure apparatus in use cannot keep up with the advances in nanofabrication.

The present invention is proposed to solve such conventional problems. An object of the present invention is to provide a resist material allowing high-precision nanofabrication without an expensive irradiating apparatus using, for example, electron beams or ion beams. Another object of the present invention is to provide a nanofabrication method allowing finer processing with exposure apparatuses currently in use and the resist material.

DISCLOSURE OF INVENTION

As described above, completely oxidized transition metals such as $MoO_3$ and $WO_3$ are conventionally used as a resist material. These metals, however, present difficulty in nanofabrication by exposure with ultraviolet or visible light because these metals are transparent to ultraviolet or visible light to exhibit significantly low absorption.

As a result of study on this problem, the present inventors have found the possibility of applying transition metal oxides to a resist material and a nanofabrication method. When the oxygen content of a transition metal oxide even slightly deviates from the stoichiometric oxygen content, the oxide absorbs a large amount of ultraviolet or visible light, which changes the chemical characteristics of the oxide. This change increases the proportional constant K in equation (1) above to reduce the minimum pit length P.

The resist material according to the present invention has been invented based on the above knowledge. The resist material includes an incompletely oxidized transition metal having an oxygen content lower than the stoichiometric oxygen content corresponding to a possible valence of the transition metal.

The nanofabrication method according to the present invention includes the steps of depositing a resist layer of a resist material including an incompletely oxidized transition metal having an oxygen content lower than the stoichiometric oxygen content corresponding to a possible valence of the transition metal on a substrate; exposing the resist layer selectively; and developing the resist layer to be patterned into a predetermined form.

The incompletely oxidized transition metal herein is defined as a compound having an oxygen content deviated to a lower content than the stoichiometric oxygen content corresponding to a possible valence of the transition metal. In other words, the compound has an oxygen content lower than the stoichiometric oxygen content corresponding to a possible valence of the transition metal.

An incomplete oxide containing plural kinds of transition metals probably have a crystal structure in which one transition metal atoms are partially replaced with the other transition metal atoms. Such an oxide is determined to be incomplete according to whether the transition metals have oxygen contents lower than their possible stoichiometric oxygen contents.

The incompletely oxidized transition metal used as the resist material of the present invention absorbs ultraviolet or visible light to allow exposure without a special exposure source using, for example, electron beams or ion beams. Furthermore, the incompletely oxidized transition metal is a low molecular metal to provide a clearer boundary between unexposed and exposed areas than a polymeric organic resist. This transition metal can be used as a resist material to provide a high-precision resist pattern.

BRIEF DESCRIPTION OF THE DRAWINGS

FIGS. 3A and 3B show examples of irradiation pulses; FIG. 3C shows an example of continuous light.

FIG. 4A illustrates the step of depositing first and second resist layers; FIG. 4B illustrates the step of patterning the first resist layer; FIG. 4C illustrates the step of etching the second resist layer; and FIG. 4D illustrates the step of removing the first resist layer.

BEST MODE FOR CARRYING OUT THE INVENTION

Figure 1:
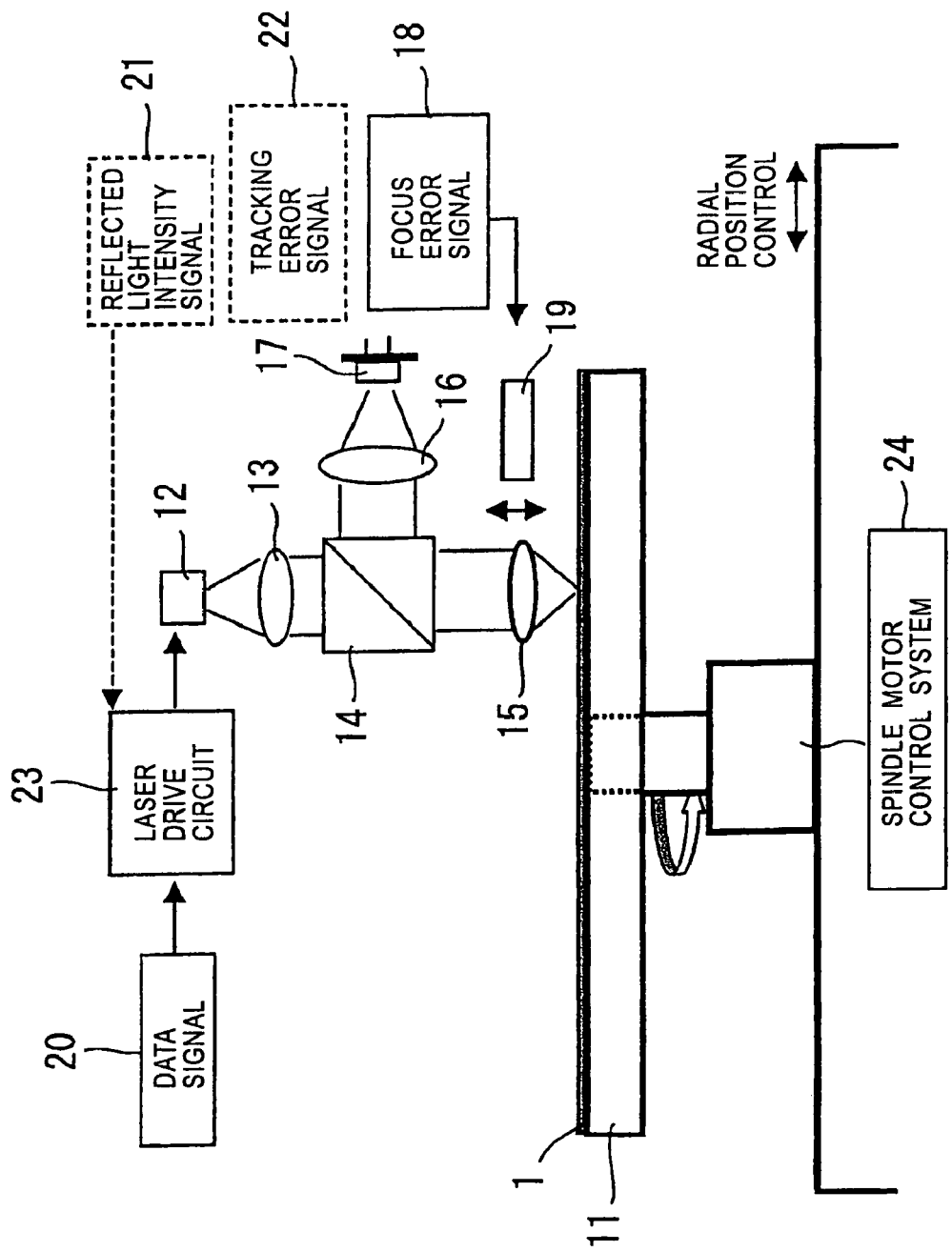
FIG. 1 is a block diagram of an exposure apparatus used in a nanofabrication method according to the present invention.

A resist material and a nanofabrication method according to the present invention will now be described in detail with reference to the drawings.

The resist material according to the present invention is an incompletely oxidized transition metal. Herein the incompletely oxidized transition metal is defined as a compound having an oxygen content deviated to a lower content from the stoichiometric oxygen content corresponding to a possible valence of the transition metal. In other words, the incompletely oxidized transition metal is defined as a compound having an oxygen content lower than the stoichiometric oxygen content corresponding to a possible valence of the transition metal.

The oxidized transition metal will now be exemplified by chemical formula $MoO_3$. When the oxidation state of the chemical formula $MoO_3$ is represented by composition $Mo_{1-x}O_x$, $x=0.75$ indicates a complete oxide whereas $0<x<0.75$ indicates an incomplete oxide having an oxygen content lower than the stoichiometric oxygen content.

Some transition metals can form oxides with different valences. For such metals, the present invention is limited to incompletely oxidized transition metals having an actual oxygen content lower than the stoichiometric oxygen content corresponding to the possible valences of the transition metals. For example, molybdenum oxide is most stable in the trivalent state ($MoO_3$) described above, and can also be present in the monovalent state (MoO). When MoO is represented by composition $Mo_{1-x}O_x$, $0<x<0.5$ indicates an incomplete oxide having an oxygen content lower than the stoichiometric oxygen content. The valences of the transition metal oxides can be analyzed with commercially available analytical instruments.

These incompletely oxidized transition metals absorb ultraviolet or visible light to change their chemical characteristics by the irradiation of ultraviolet or visible light. This change causes selectivity in the resist, that is, a difference in etching rate between exposed and unexposed areas during the developing step, although the resist is an inorganic resist (this will be described below in detail). In addition, particles in a resist material film of an incompletely oxidized transition metal are so small as to provide a clear pattern at the boundary between exposed and unexposed areas, resulting in high resolution.

The incompletely oxidized transition metals change their characteristics as a resist material according to the degree of oxidation. Thus, the optimum degree of oxidation may be selected in each case. For example, an incompletely oxidized transition metal having an oxygen content much lower than the stoichiometric oxygen content of the transition metal oxidized completely has disadvantages such as higher irradiation power for the exposure step and a longer developing time. Therefore, the incompletely oxidized transition metal preferably has an oxygen content slightly lower than the stoichiometric oxygen content of the transition metal oxidized completely.

Examples of transition metals for the resist material include Ti, V, Cr, Mn, Fe, Nb, Cu, Ni, Co, Mo, Ta, W, Zr, Ru, and Ag. Among these, Mo, W, Cr, Fe, and Nb are preferable. Furthermore, Mo and W are more preferable in that significant changes occur by ultraviolet or visible light.

In the present invention, the incomplete oxide may contain one, two, three or more transition metals, or another element except transition metals. In particular, the incomplete oxide preferably contains plural kinds of metal elements.

When the incomplete oxide contains not only one but also two or three or more transition metals, the incomplete oxide probably has a crystal structure in which one transition metal atoms are partially replaced with the other transition metal atoms. Such an oxide is determined to be incomplete according to whether the transition metals have oxygen contents lower than their possible stoichiometric oxygen contents.

Available elements except transition metals include Al, C, B, Si, and Ge, and at least one of these elements can be used. A combination of two or more kinds of transition metals or addition of an element other than transition metals provides an incompletely oxidized transition metal containing smaller crystal particles. This forms a clearer boundary between exposed and unexposed areas, leading to significant increases in resolution and exposure sensitivity.

The above resist materials may be prepared by sputtering in an $Ar+O_2$ atmosphere with a target containing a predetermined transition metal. For example, the flow rate of $O_2$ into a chamber is set to 5% to 20% of the total gas flow rate, and the gas pressure is set to 1 to 10 Pa, which are employed in normal sputtering.

Next, a nanofabrication method using the above resist materials will be described.

The nanofabrication method of the present invention, for example, includes the steps of depositing a resist material of an incompletely oxidized transition metal on a substrate to form a resist layer; exposing the resist layer selectively; and developing the resist layer to form a predetermined pattern. An example will now be described in which the nanofabrication method of the present invention is applied to a cutting step of a resist master for optical discs. Of course, the nanofabrication method of the present invention is not limited to the following example and is also applicable to nanofabrication of various electronic devices such as semiconductor devices, optical devices, displays, and magnetic devices.

[Step of Forming Resist Layer]

A resist layer of an incompletely oxidized transition metal is deposited on a sufficiently smooth surface of a substrate. Depositing methods include, for example, sputtering in an argon-oxygen atmosphere using a sputtering target of an elemental transition metal. This method can control the degree of oxidation of an incompletely oxidized transition metal by changing the concentration of oxygen gas in a vacuum atmosphere. An incompletely oxidized transition metal containing two or more kinds of transition metals may be deposited by sputtering while the substrate is constantly rotated over different kinds of sputtering targets to mix the different transition metals. The individual charging powers of the sputtering targets can be changed to control the mixture ratio.

In addition to the above sputtering in an oxygen atmosphere using a metal target, a resist layer of an incompletely oxidized transition metal may be deposited by sputtering in a normal argon atmosphere using a target of an incompletely oxidized transition metal containing a desirable amount of oxygen.

Furthermore, a resist layer of an incompletely oxidized transition metal can readily be deposited by evaporation, as well as sputtering.

The substrate may be composed of, for example, glass, plastic such as polycarbonate, silicon, alumina-titanium carbide, or nickel.

The resist layer may have any thickness. For example, the resist layer may have a thickness within the range of 10 to 80 nm.

[Step of Exposing Resist Layer]

The substrate covered with a resist layer (hereinafter referred to as a resist substrate 1) is disposed on a turntable 11 of an exposure apparatus showed in FIG. 1 such that the surface having the resist layer faces upward.

This exposure apparatus has a beam source 12, which emits, for example, laser light capable of exposing the resist layer. The laser light is focused through a collimator lens 13, a beam splitter 14, and an objective lens 15 to be incident on the resist layer of the resist substrate 1. The light reflected by the resist substrate 1 is then focused through the beam splitter 14 and a focusing lens 16 onto a separate photodetector 17. The separate photodetector 17 detects the light reflected by the resist substrate 1 to generate focus error signals 18 from the detection results and send the focus error signal 18 to a focus actuator 19. The focus actuator 19 controls the vertical position of the objective lens 15. The turntable 11 has a feed mechanism (not shown in the drawing), which can precisely change the exposure position of the resist substrate 1. A laser drive circuit 23 controls the beam source 12 according to data signals 20, reflected light intensity signals 21, and tracking error signals 22 to perform exposure or focusing. A spindle motor control system 24 is provided on the central axis of the turntable 11. The spindle motor control system 24 determines the optimum spindle rotational speed according to the radial position of the optical system and a desired linear velocity to control the spindle motor.

In the conventional step of exposing a resist layer of an organic resist, focusing on the resist layer is not performed with a light source for exposure itself. An organic resist has chemical characteristics that change continuously by exposure; even weak light for focusing is unnecessarily reflected to expose the organic resist layer. Therefore, focusing is performed with an additional light source insensitive to an organic layer, for example, a red light source with a wavelength of 633 nm. The conventional exposure apparatus for organic resists, including two light sources of different wavelengths, requires an optical system for separating light beams of different wavelengths, and thus has drawbacks such as extreme complexity and higher costs. Moreover, in the conventional exposure apparatus for organic resists, the resolution of the focus error signals for vertical position control of the objective lens is proportional to the wavelength of the light source for detection (for example, a wavelength of 633 nm). The conventional exposure apparatus, therefore, cannot provide a resolution as yielded by the light source for exposure, thus precluding high-precision and stable focusing.

Figure 2:
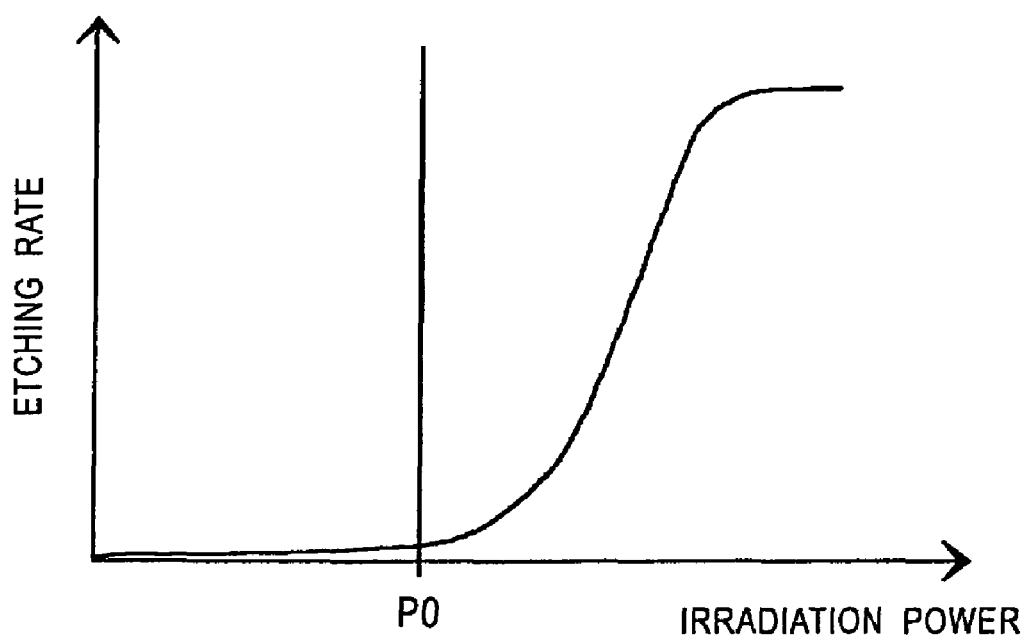
FIG. 2 is a characteristic diagram indicating the relationship between the irradiation power of a light source for exposure and the difference in etching rate between exposed and unexposed areas in exposing a resist layer of a resist material of the present invention.

On the other hand, an inorganic resist material of the present invention exhibits a steep change in chemical characteristic by exposure, as shown in FIG. 2, which indicates the relation between the irradiation power of the light source for exposure and the difference in etching rate between exposed and unexposed areas (contrast). In other words, an exposure source does not unnecessarily expose the inorganic resist in irradiation power below an irradiation threshold power P0 at which the exposure starts, even if the irradiation is repeated. This permits focusing with an exposure source of irradiation power below P0. The nanofabrication method of the present invention, therefore, eliminates use of the optical system for separating laser beams of different wavelengths to offer a low-cost exposure apparatus and high-precision focusing corresponding to the exposure wavelength, thus leading to precise nanofabrication. In addition, the inorganic resist material of the present invention, which is not exposed by weak light below the irradiation threshold power P0, does not need to block ultraviolet light from room lighting, unlike normal processes for organic resists.

After focusing light below the irradiation threshold power P0 as described above, the turntable 11 is moved to a desired radial position. In this case, the turntable 11 is moved to change the exposure position on the resist substrate 1 while the position of the optical system including the objective lens 15 is fixed across the plane. Alternatively, the position of the optical system may be changed while the turntable 11 holding the resist substrate 1 is fixed.

The beam source 12 emits laser light while the turntable 11 is rotated to expose the resist layer. This exposure forms a latent image of fine irregularities, which is a spiral groove in recording discs, by moving the rotating turntable 11 continuously at a low rate across the radius of the resist substrate 1. In optical discs, meandering irregular pits and grooves for information data are formed as the latent image of fine irregularities. For production of discs having concentric tracks, such as magnetic hard discs, the turntable 11 or the optical system is moved stepwise not continuously.

Figure 3A:
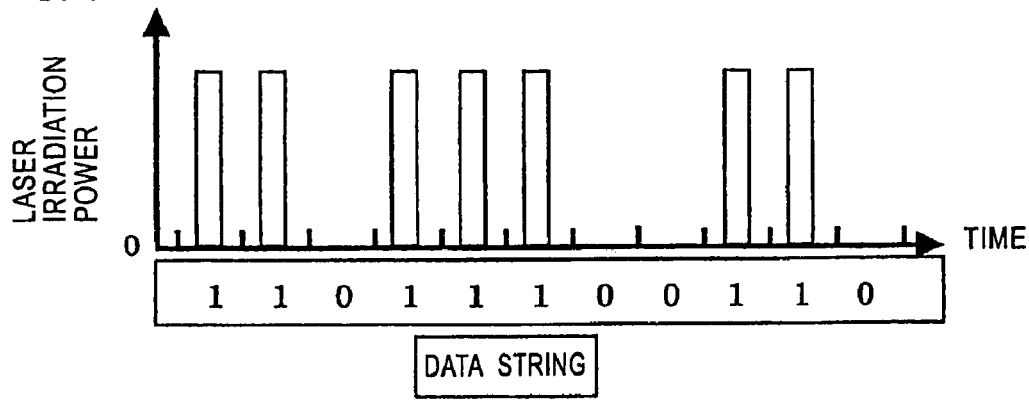
FIGS. 3A to 3C are characteristic diagrams showing examples of irradiation patterns in the exposure process.
Figure 3B:
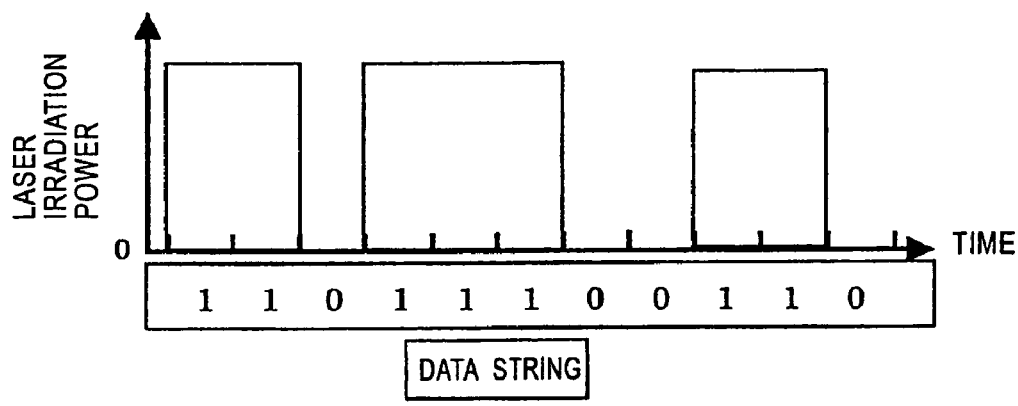
Figure 3C:
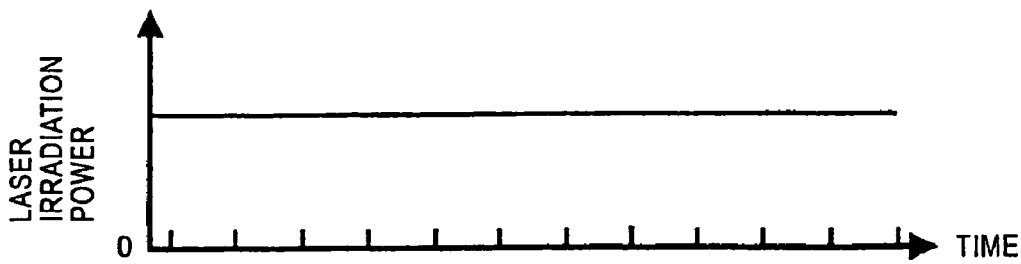

Under the above settings, the beam source 12 emits pulsed or continuous light having a desired power not less than the irradiation threshold power P0 and corresponding to pits or grooves according to information data to expose the resist layer sequentially from a desired position of the resist substrate 1. Examples of the pulsed light are shown in FIGS. 3A and 3B; an example of the continuous light is shown in FIG. 3C.

The resist materials of incompletely oxidized transition metals according to the present invention undergo a change in chemical characteristic by irradiation of ultraviolet or visible light having the irradiation threshold power P0 or more to produce selectivity, that is, a difference in etching rate to alkali or acid between exposed and unexposed areas.

As the irradiation power decreases, a shorter and narrower pit can be formed, although extremely low irradiation power closing to the irradiation threshold power impairs stable pattern formation. Therefore, the exposure requires the optimum irradiation power in each case.

The present inventors actually confirmed that the selectivity was provided by a combination of the resist material of the present invention and exposure using a red semiconductor laser with a wavelength of 660 nm and a mercury lamp with peaks at wavelengths of about 185 nm, 254 nm, and 405 nm to form a fine pit pattern.

[Step of Developing Resist Layer]

After the pattern exposure, the resist substrate 1 is developed to form a resist master for optical discs. This resist master has fine irregularities of pits and grooves corresponding to the predetermined exposure pattern.

In development, a wet process using a liquid such as acids or alkalis provides the selectivity. The liquid can be properly selected depending on, for example, the purpose, application, and apparatus. Examples of alkaline developers for the wet process include a tetramethylammonium hydroxide solution and inorganic alkaline aqueous solutions containing, for example, KOH, NaOH, and $Na_2CO_3$; examples of acid developers for the wet process include hydrochloric acid, nitric acid, sulfuric acid, and phosphoric acid. In addition to the wet process, the present inventors confirmed that development can be achieved through a dry process such as plasma etching or reactive ion etching (RIE) by controlling the kinds and mixing ratio of gases.

A method for controlling the exposure sensitivity will now be described. For example, in terms of composition $W_{1-x}O_x$, a transition metal oxide represented by chemical formula $WO_3$ exhibits high exposure sensitivity for a range of $0.1<x<0.75$, wherein $x=0.1$ indicates a critical value which causes disadvantages such as a larger irradiation power necessary for the exposure step and a longer time for development. The highest exposure sensitivity is achieved by x in the range of about 0.4 to 0.7.

In terms of composition $Mo_{1-x}O_x$, a transition metal oxide represented by chemical formula $MoO_3$ exhibits high exposure sensitivity for a range of $0.1<x<0.75$, wherein $x=0.1$ indicates a critical value which causes disadvantages such as a larger irradiation power necessary for the exposure step and a longer time for development. The highest exposure sensitivity is achieved by x in the range of about 0.4 to 0.7.

In terms of composition $Mo_{1-x}O_x$, a transition metal oxide represented by chemical formula MoO exhibits high exposure sensitivity for a range of $0.1<x<0.5$, wherein $x=0.1$ indicates a critical value which causes disadvantages such as a larger irradiation power necessary for the exposure step and a longer time for development.

Higher exposure sensitivity of a resist material has advantages such as a lower irradiation power for the exposure and a shorter exposure time corresponding to the pulse width or linear velocity. However, excessively high sensitivity has disadvantages such as unnecessary exposure during the focusing and adverse effects from the lighting environment in the process room. Therefore, the optimum exposure sensitivity is selected depending on the purpose in each case. Not only changing the oxygen content but also adding another transition metal to an incompletely oxidized transition metal is effective in controlling the exposure sensitivity of the resist material according to the present invention. For example, addition of Mo to $W_{1-x}O_x$ improves the exposure sensitivity by about 30%.

The exposure sensitivity can be controlled by not only changing the composition of a resist material but also selecting the material for the substrate or performing pre-exposure treatment on the substrate. In fact, a study was performed on the difference in exposure sensitivity between different kinds of substrates using quartz, silicon, glass, and plastic (polycarbonate) as the substrate. The study confirmed that the exposure sensitivity depends on the kind of substrate and, specifically, the order of the sensitivity is silicon, quartz, glass, and plastic. This order corresponds to that of thermal conductivity; a substrate with lower thermal conductivity exhibits higher exposure sensitivity. This is because a substrate with lower thermal conductivity causes a larger increase in temperature during the exposure and thus a large change in the chemical characteristics of the resist material.

Examples of the pre-exposure treatment include forming an intermediate layer between a substrate and a resist layer, heat treatment, and ultraviolet light irradiation treatment.

In particular, for substrates with high thermal conductivity, such as a silicon wafer of single crystal silicon, the exposure sensitivity can be properly improved by forming an intermediate layer with relatively low thermal conductivity on the substrate. This is because the intermediate layer improves the thermal charge of the resist material during the exposure. Materials suitable for the intermediate layer with low thermal conductivity include amorphous silicon, silicon dioxide ($SiO_2$), silicon nitride (SiN), and alumina ($Al_2O_3$). The intermediate layer may be formed by sputtering or other evaporation processes.

Another substrate is made of quartz, is coated with an ultraviolet curable resin having a thickness of 5 μm by spin coating, and is irradiated with ultraviolet light to cure the liquid resin. The substrate was observed to have higher exposure sensitivity than an untreated quartz substrate. This can also be explained by the fact that the ultraviolet curable resin has thermal conductivity as low as that of a plastic material.

Furthermore, the exposure sensitivity may be improved by pre-exposure treatment such as heat treatment and ultraviolet light irradiation. This is because the pre-exposure treatment, incompletely and to some extent, change the chemical characteristics of the resist material of the present invention.

As described above, incompletely oxidized transition metal resists have a variety of characteristics determined by, for example, material compositions, development conditions, and the selection of a substrate. Furthermore, a two-layer resist process is outstandingly effective for extending a range of applications as a resist material. An outline of the two-layer resist process will now be described with reference to FIGS. 4A to 4D.

Figure 4A:
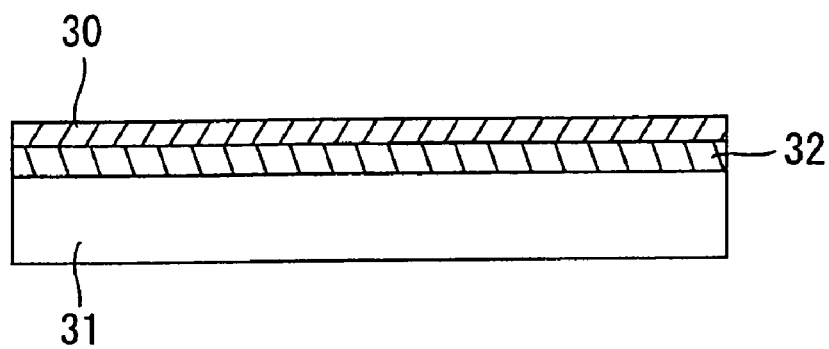
FIGS. 4A to 4D are schematic sectional views illustrating the relevant part of a two-layer resist process.

Referring to FIG. 4A, a second resist layer 32 is deposited on a substrate 31, and then a first resist layer 30 of an incompletely oxidized transition metal according to the present invention is deposited on the second resist layer 32. The second resist layer 32 is made of a material that provides significantly high selectivity to the incompletely oxidized transition metal of the first resist layer 30.

Figure 4B:
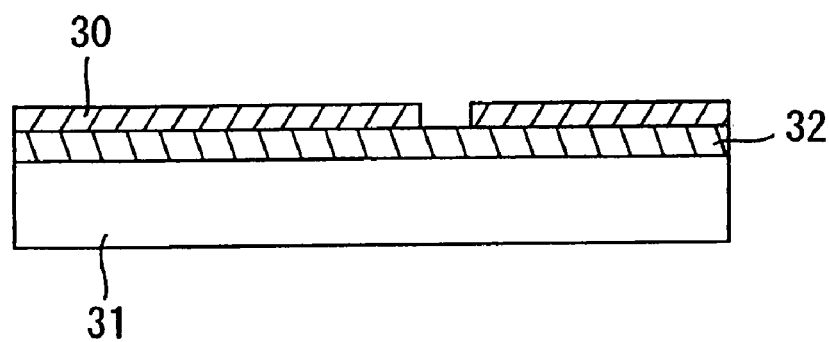

Referring to FIG. 4B, the first resist layer 30 is exposed and developed to be patterned.

Figure 4C:
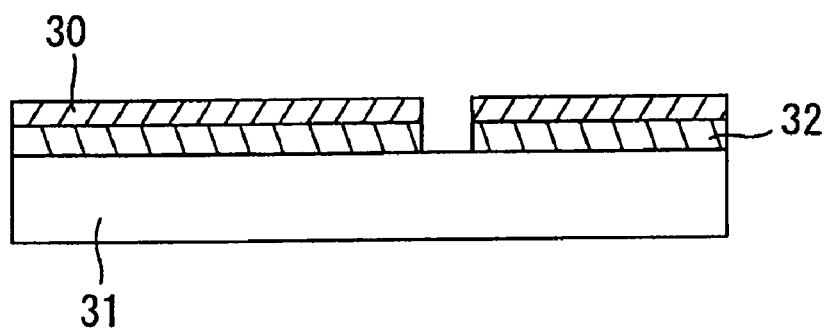

Referring to FIG. 4C, the second resist layer 32 is etched through the mask pattern of the first resist layer 30 under etching conditions of high selectivity to transfer the pattern of the first resist layer 30 to the second resist layer 32.

Figure 4D:
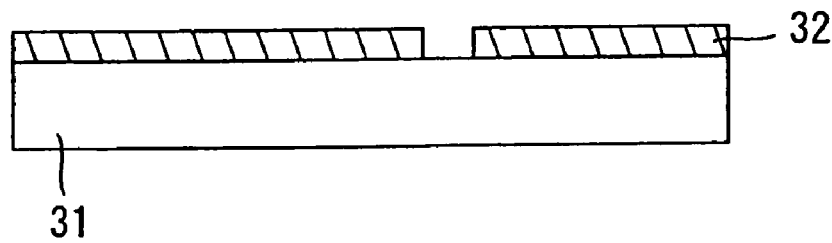

Referring to FIG. 4D, the first resist layer 30 is finally removed to complete the patterning of the second resist layer 32.

In applying a two-layer resist process to the present invention, for example, substantially infinite selectivity will be yielded between a first resist layer of an incompletely oxidized transition metal and a second resist layer by, for example, RIE or plasma etching using a fluorocarbon gas, quartz as a substrate, and a transition metal, such as Cr, as the second resist layer.

The nanofabrication method of the present invention, as described above, uses resist materials of the above incompletely oxidized transition metals. This results in the advantage that exposure can be carried out by a combination of an inorganic resist and ultraviolet or visible light. These inorganic resists are quite different from conventional ones in that the conventional inorganic resists cannot be combined with ultraviolet or visible light as an exposure source because the conventional inorganic resists are optically transparent to ultraviolet or visible light, and therefore require an expensive exposure apparatus such as an electron beam or ion beam apparatus.

Moreover, the nanofabrication method uses ultraviolet or visible light having a high drawing speed to greatly reduce the time required for exposure as compared to nanofabrication methods using the conventional inorganic resists and electron beams.

Furthermore, the nanofabrication method uses the inorganic resist materials of incompletely oxidized transition metals to provide a clear pattern at the boundary between exposed and unexposed areas, thereby achieving high-precision nanofabrication. In addition to this, in exposure, the nanofabrication method permits focusing by an exposure source itself, leading to high resolution.

To form a fine pattern, as described above, the nanofabrication method of the present invention employs an approach to decrease the proportional constant K in the relation represented by $P=K \cdot \lambda/NA$. This approach is different from the conventional approach to achieve nanofabrication at a shorter exposure wavelength $\lambda$ and a larger numerical aperture NA of the objective lens. This approach allows formation of a finer pattern using exposure apparatuses currently in use. Specifically, the present invention allows the proportional constant K to be below 0.8 and the minimum nanofabrication cycle f of a workpiece to be reduced as follows:

$$f<0.8\lambda/NA$$

The present invention, therefore, achieves the provision of inexpensive devices allowing direct use of exposure apparatuses currently in use as well as finer processing.

EXAMPLES

Examples of the present invention will now be described according to the experimental results.

Example 1

In Example 1, a resist master for optical discs was prepared with incompletely oxidized trivalent tungsten as a resist material.

A resist layer of incompletely oxidized tungsten was uniformly deposited on a glass substrate having a sufficiently smooth surface by sputtering. The sputtering was carried out with elemental tungsten as a sputtering target in an argon-oxygen mixed atmosphere, of which the oxygen gas concentration was changed to control the degree of oxidation of the incompletely oxidized tungsten.

The deposited resist layer was analyzed with an energy dispersive X-ray spectrometer (EDX) to give x=0.63 in terms of composition $W_{1-x}O_x$, wherein the resist layer was 40 nm thick; and the dependence of the refractive index on the wavelength was measured by spectroellipsometry.

The substrate covered with the resist layer was disposed on the turntable in the exposure apparatus shown in FIG. 1. The resist layer was irradiated with a laser having an irradiation power below the irradiation threshold power while the turntable was rotated at a predetermined rotational speed. The vertical position of the objective lens was adjusted with an actuator so that the laser was focused on the resist layer.

While the optical system was fixed, the resist layer was moved together with the turntable to a desired radial position by the feed mechanism provided on the turntable and was irradiated to be exposed with pulsed light corresponding to pits according to information data. The exposure was carried out while the rotating turntable was moved continuously and slightly across the radius of the resist substrate, where the exposure wavelength was 0.405 nm; the numerical aperture NA of the exposure optical system was 0.95; the linear velocity during the exposure was 2.5 m/s; and the irradiation power was 6.0 mW.

After the exposure, the resist substrate was developed through a wet process with an alkaline developer. In the developing step, the resist substrate was developed in the alkaline developer while ultrasonic waves were applied to ensure the uniformity of etching. The developed substrate was sufficiently washed with pure water and isopropyl alcohol and then was dried by, for example, an air blast to finish the process. A tetramethylammonium hydroxide solution was used as the alkaline developer and the developing time was set to 30 minutes.

Figure 5:
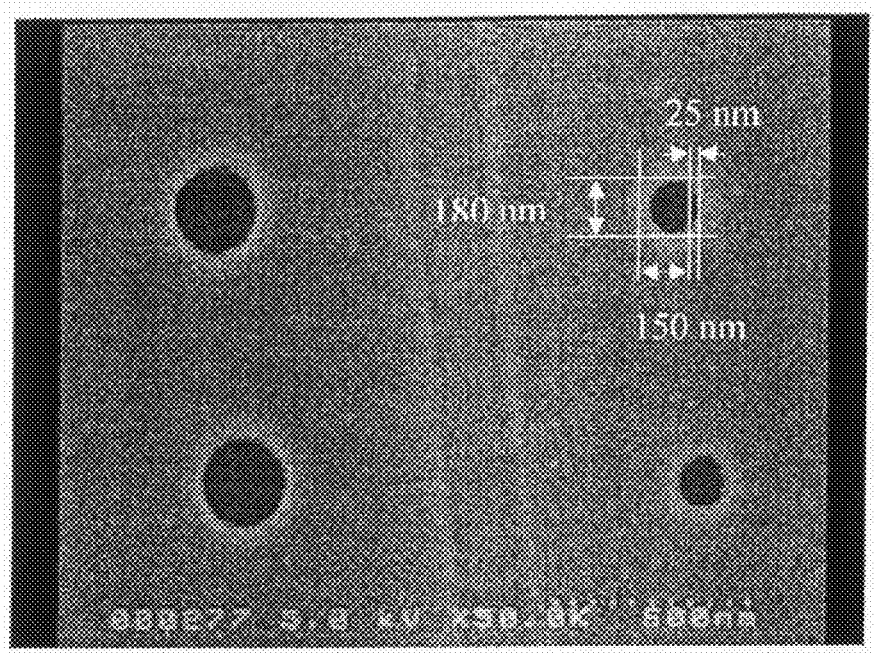
FIG. 5 is a photograph observed by SEM and showing a developed resist layer of incompletely oxidized tungsten.

FIG. 5 shows a developed resist pattern, which was observed with a scanning electron microscope (SEM). In FIG. 5, pits correspond to the exposed areas and are concave with respect to the unexposed area of the resist layer. This shows that the resist material of incompletely oxidized tungsten functions as a positive resist. Namely, in the resist layer of incompletely oxidized tungsten, the etching rate at the unexposed area was lower than that at the exposed areas so that the unexposed area of the resist layer substantially kept the deposited thickness after the development. In contrast, the exposed areas of the resist layer were removed by etching to reveal the surface of the glass substrate at these areas.

The minimum pit size of the four pits shown in FIG. 5 was 0.15 μm wide and 0.18 μm long. This shows that the nanofabrication method using the resist material according to the present invention significantly increases resolution compared with the conventional organic resists, which probably have a pit width of 0.39 μm. In addition, FIG. 5 shows that the edges of the pits are very clear.

Furthermore, the width and length of the pits after the development varied with the irradiation power and pulse width of the exposure source.

Example 2

In Example 2, a resist master for optical discs was prepared with incompletely oxidized trivalent molybdenum as a resist material.

Figure 6:
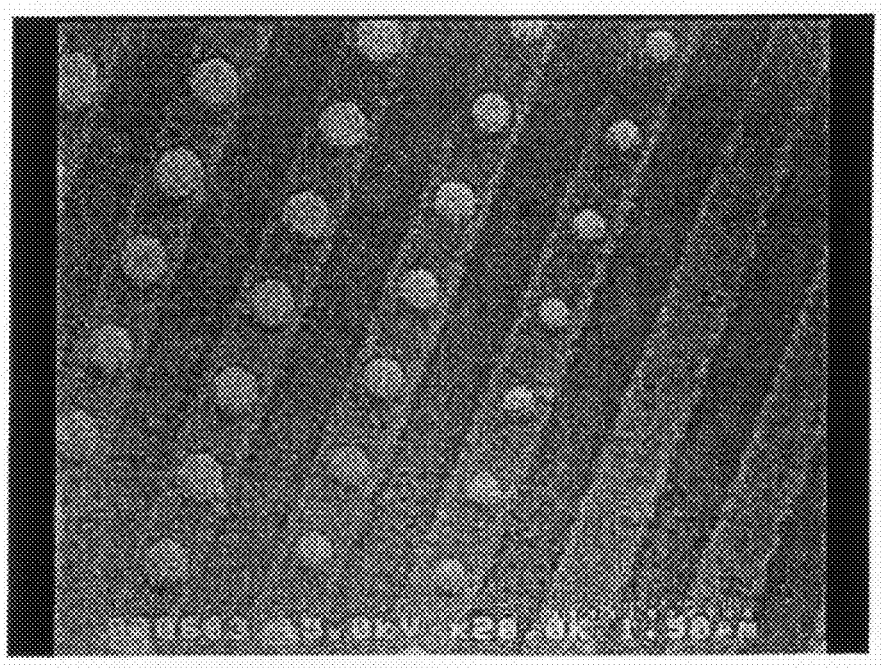
FIG. 6 is a photograph observed by SEM and showing a developed resist layer of incompletely oxidized molybdenum.

Example 2 employed nearly the same process as Example 1 except that molybdenum was used as a sputtering target. Through the process, a resist layer of incompletely oxidized molybdenum was deposited on a glass substrate, was exposed, and was developed to form pits, as shown in FIG. 6. The deposited resist layer was analyzed with an EDX to give x=0.59 in terms of composition $Mo_{1-x}O_x$.

In contrast with incompletely oxidized tungsten, the resist layer of the incompletely oxidized molybdenum forms pits at exposed areas, which are convex with respect to an unexposed area, as shown in FIG. 6. This is because the incompletely oxidized molybdenum functions as a negative resist to the tetramethylammonium hydroxide solution.

Comparative Example 1

In Comparative Example 1, a resist master for optical discs was prepared with completely oxidized trivalent tungsten as a resist material.

A resist layer of completely oxidized tungsten was deposited on a glass substrate by sputtering. The deposited resist layer was analyzed with an EDX to give x=0.75 in terms of composition $W_{1-x}O_x$. In this connection, electron diffraction analysis using a transmission electron microscope revealed that the crystalline state of incompletely oxidized monovalent tungsten was amorphous before exposure.

This resist layer was exposed at irradiation power equivalent to that in Examples 1 and 2 or sufficiently high irradiation power. However, the resist layer did not provide selectivity more than 1, thus failing to form a desired pit pattern. That is, the completely oxidized tungsten, optically transparent to the exposure source, had low absorption, which precluded the chemical changes of the resist material.

Comparative Example 2

In Comparative Example 2, a resist master for optical discs was prepared with completely oxidized trivalent molybdenum as a resist material.

A resist layer of completely oxidized molybdenum was deposited on a glass substrate by sputtering. The deposited resist layer was analyzed with an EDX to give x=0.75 in terms of composition $W_{1-x}O_x$.

This resist layer was exposed at irradiation power equivalent to that in Examples 1 and 2 or sufficiently high irradiation power. However, the resist layer did not provide selectivity more than 20.1, failing to form a desired pit pattern. That is, the completely oxidized molybdenum, optically transparent to the exposure source as well as the completely oxidized tungsten, had low absorption, which precluded the chemical changes of the resist material.

Example 3

Figure 7:
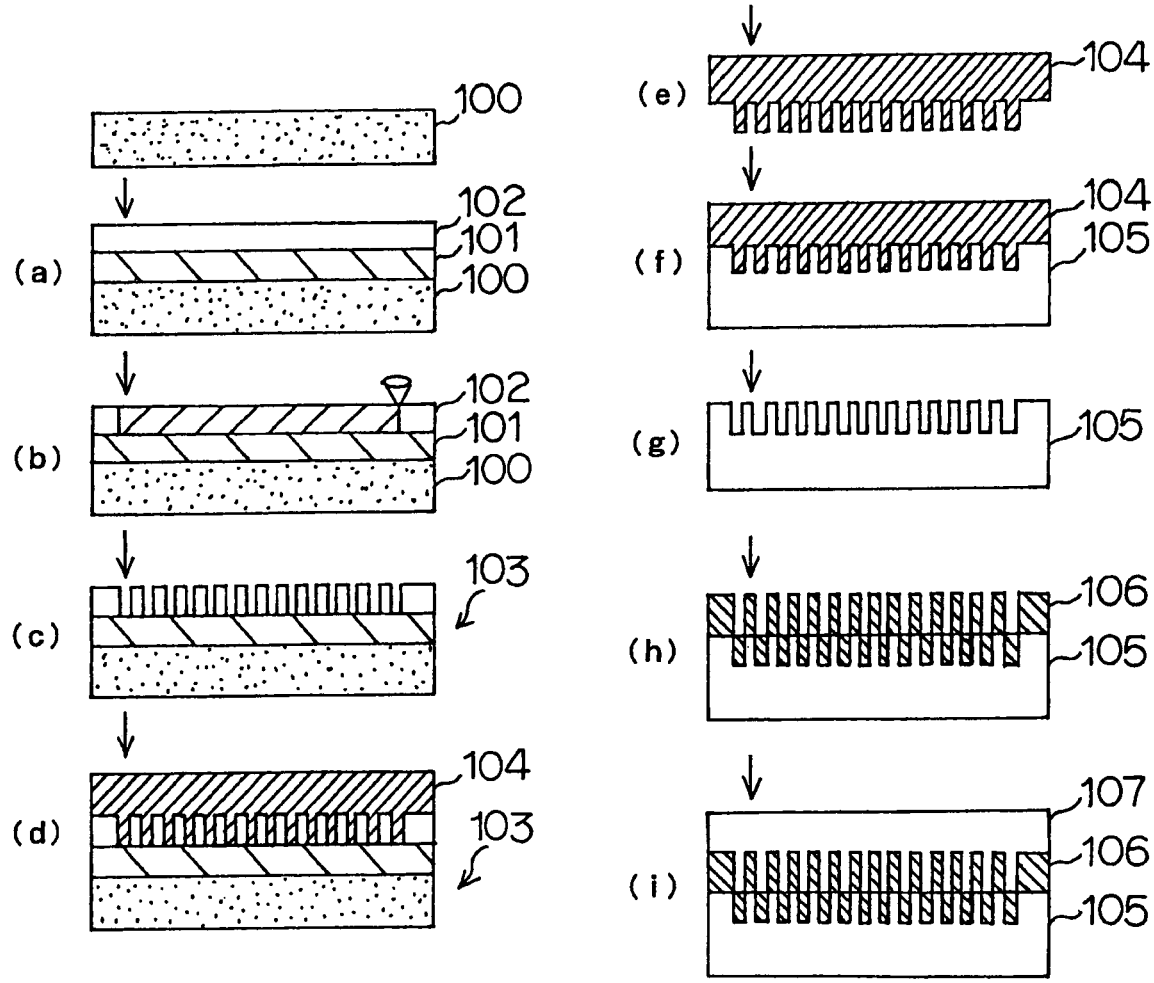
FIG. 7 is a process chart of producing an optical disc by a nanofabrication method according to the present invention.

In Example 3, a resist master for optical discs was prepared with incompletely oxidized trivalent tungsten and molybdenum as resist materials, and an optical disc was finally prepared. FIG. 7 shows an outline of the preparation process.

An amorphous silicon intermediate layer 101 having a thickness of 80 nm was uniformly deposited on a substrate 100 of a silicon wafer by sputtering. A resist layer 102 of incompletely oxidized tungsten and molybdenum was further uniformly deposited on the substrate 100 by sputtering (FIG. 7(a)). The sputtering was performed in an argon atmosphere with a sputtering target of incompletely oxidized tungsten and molybdenum. The deposited resist layer was analyzed with an EDX to give 80:20 in the ratio of tungsten to molybdenum contained in the deposited incompletely oxidized tungsten and molybdenum, and 60 atomic percent in oxygen content. The resist layer had a thickness of 55 nm. Electron diffraction analysis by a transmission electron microscope revealed that the crystalline state of the incompletely oxidized monovalent tungsten and molybdenum were amorphous before exposure.

In subsequent steps including exposure of the resist layer, a resist master 103 for optical discs was prepared as in Example 1 except for exposure conditions (FIGS. 7(b) and (c)). The exposure conditions in Example 3 are as follows: exposure wavelength: 0.405 nm; numerical aperture NA of exposure optical system: 0.95; modulation: 17 PP; pit length: 112 nm; track pitch: 320 nm; linear velocity during exposure: 4.92 m/s; exposure irradiation power: 6.0 mW; writing: simplified writing, the same as that for phase change discs.

Figure 8:
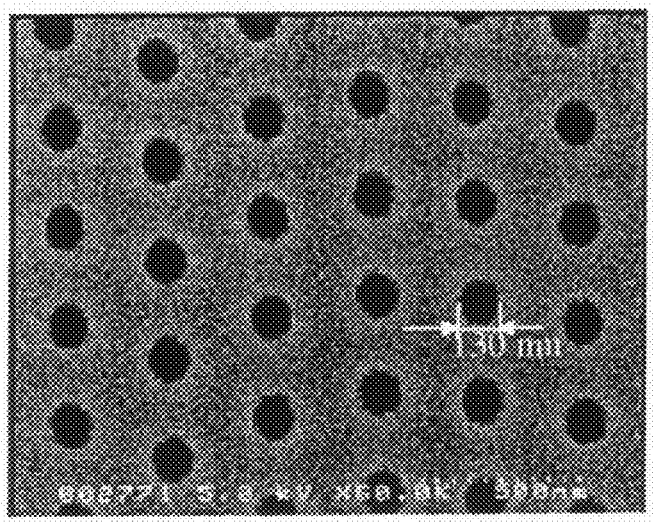
FIG. 8 is a photograph observed by SEM and showing a developed resist layer of incompletely oxidized tungsten and molybdenum.

FIG. 8 shows an example of the resist master for optical discs after development, which was observed by SEM. The resist material of incompletely oxidized tungsten and molybdenum functioned as a positive resist. FIG. 8 shows that pits correspond to exposed areas and are concave with respect to the unexposed area of the resist layer. The length (diameter) of the pits formed was about 130 nm. This pit length is below the minimum pit length of 170 nm (0.17 μm), which is required for a high-density optical disc with a recording capacity of 25 GB per side. The resist pattern had pits of the same shape at constant pitches of 300 nm in the pit line direction and 320 nm in the track direction, showing that pits can be formed stably.

A metal nickel film was then deposited on the surface having the irregular pattern of the resist-pattered master by electroplating (FIG. 7(d)). The resist master was separated from the film, which was subjected to a predetermined process to provide a stamper 104 for molding (FIG. 7(e)). The stamper 104 had the same irregular pattern as that of the resist master.

The stamper for molding was used to duplicate a resin disc 105 of polycarbonate, which is a thermoplastic resin, by injection molding (FIG. 7(f)). The irregular surface of the resin disc was then covered with a reflective film 106 of AL alloy (FIG. 7(h)) and a protective film 107 with a thickness of 0.1 mm to form an optical disc 12 cm in diameter (FIG. 7(i)). The above steps of producing the optical disc using the resist master were the known art.

Figure 9:
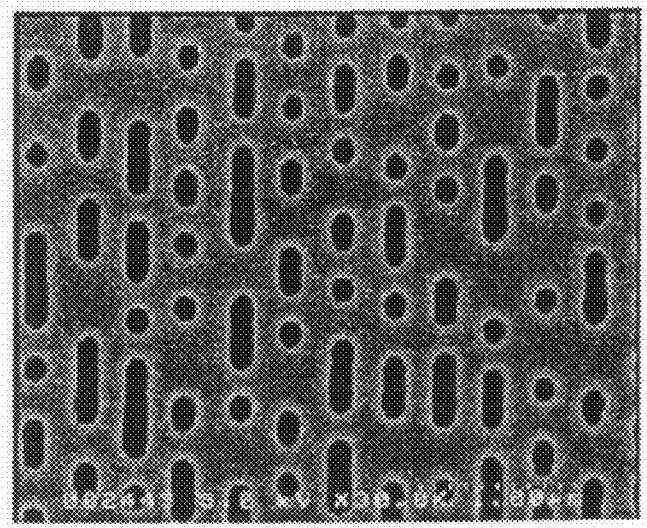
FIG. 9 is a photograph showing a pit pattern on a surface of an optical disc with a recording capacity of 25 GB produced in Example 3.

FIG. 9 shows an example of a pit pattern observed by SEM on a surface of the above optical disc. The pit pattern included pits such as ones with a length of 150 nm and linear ones with a width of 130 nm, which corresponded to the actual signal pattern. This indicates that the optical disc had a recording capacity of 25 GB.

An eye pattern of RF signals was then read out from the above optical disc under the following conditions:

| | |
|---|---|
| tracking servo: | push-pull method |
| modulation: | 17 PP |
| pit length: | 112 nm |
| track pitch: | 320 nm |
| readout linear velocity: | 4.92 m/s |
| readout irradiation power: | 0.4 mW |

Figure 10A:
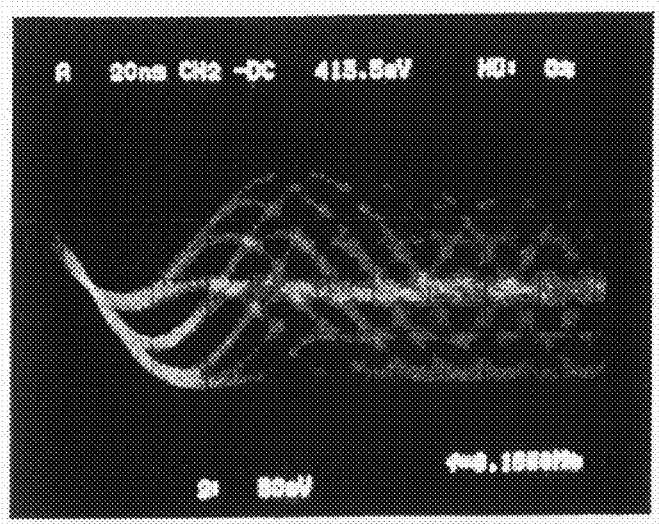
FIGS. 10A to 10C are photographs showing the signal evaluation of the optical disc with a recording capacity of 25 GB produced in Example 3.
Figure 10B:
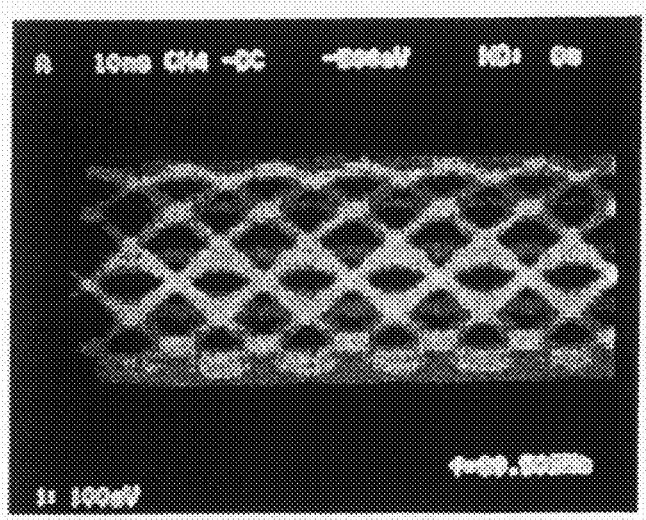
Figure 10C:
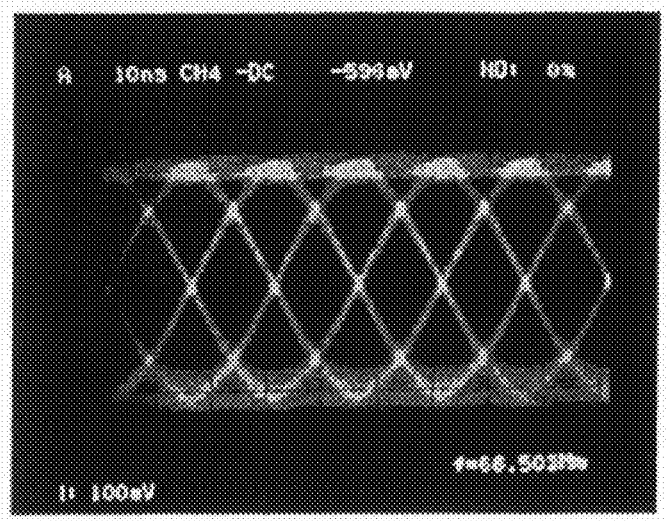

FIG. 10 shows the signal evaluation of the eye pattern.

The eye pattern as read out (FIG. 10A) was processed by conventional equalization to provide an eye pattern (FIG. 10B) showing a jitter value of 8.0%, and processed by limit equalization to provide an eye pattern (FIG. 10C) showing a jitter value of 4.6%. These sufficiently low values are satisfactory results in practice for a ROM disc having a recording capacity of 25 GB.

INDUSTRIAL APPLICABILITY

As is obvious from the above description, the resist material according to the present invention is made of an incompletely oxidized transition metal that absorbs ultraviolet or visible light. The resist material, therefore, allows exposure with exposure apparatuses currently in use, which use ultraviolet or visible light as an exposure source. Furthermore, the incompletely oxidized transition metal, having a small molecular size, is used as a resist material to provide an excellent edge pattern, permitting high-precision patterning.

Accordingly, the nanofabrication method using such a resist material can simultaneously achieve the provision of inexpensive devices and finer processing.

The invention claimed is:

1. A resist material comprising an incompletely oxidized transition metal alloy having an oxygen content lower than the stoichiometric oxygen content of the completely oxidized transition metal alloy;
   wherein the resist material is exclusively comprised of a single resist layer having a resist material that is comprised of the incompletely oxidized transition metal.

2. A resist material comprising an incompletely oxidized transition metal alloy having an oxygen content lower than the stoichiometric oxygen content of the completely oxidized transition metal alloy;
   wherein the resist material is exclusively comprised of a single resist layer having a resist material that is comprised of the incompletely oxidized transition metal and, wherein the resist material further comprises an amorphous inorganic material including the oxide.

3. The resist material according to claim 2, wherein the transition metal is comprised of at least one of Ti, V, Cr, Mn, Fe, Nb, Cu, Ni, Co, Mo, Ta, W, Zr, Ru, and Ag.

4. The resist material according to claim 2, wherein the resist material further comprises an element other than transition metals which is at least one of Al, C, B, Si, and Ge.

5. The resist material of claim 2, wherein the oxygen content of the resist material is only slightly lower than the stoichiometric oxygen content of the completely oxidized transition metal alloy.

6. The resist material according to claim 2, wherein the transition metal alloy includes tungsten and molybdenum provided in a ratio of approximately 80:20 and the oxidized transition metal alloy includes an oxygen content of approximately 60 atomic percent.

7. A nanofabrication method for manufacturing on optical disc comprising the steps of:
   depositing a resist layer of a resist material including an incompletely oxidized transition metal alloy having an oxygen content lower than the stoichiometric oxygen content corresponding to the completely oxidized transition metal over a substrate;
   selectively exposing the resist layer; and
   developing the resist layer to be patterned into a predetermined form of an optical disc structure.

8. A nanofabrication method for manufacturing on optical disc comprising the steps of:
   depositing a resist layer of a resist material that is comprised of an incompletely oxidized transition metal alloy having an oxygen content lower than the stoichiometric oxygen content corresponding to the completely oxidized transition metal over a substrate;
   selectively exposing the resist layer; and
   developing the resist layer to be patterned into a predetermined form of an optical disc structure, wherein the resist material comprises an amorphous inorganic material including the oxide.

9. The nanofabrication method according to claim 8, wherein the exposure is performed using ultraviolet or visible light.

10. The nanofabrication method according to claim 9, wherein the ultraviolet or visible light has a wavelength in the range of 150 to 410 nm.

11. The nanofabrication method according to claim 8, wherein the development is performed using at least one of an organic alkaline aqueous solution, an inorganic alkaline aqueous solution, and an acid aqueous solution.

12. The nanofabrication method according to claim 8, wherein the resist layer is formed on a substrate comprising at least one of glass, plastic, silicon, alumina-titanium carbide, and nickel.

13. The nanofabrication method according to claim 12, wherein an intermediate layer having lower heat conductivity than the substrate is formed between the substrate and the resist layer.

14. The nanofabrication method according to claim 13, wherein the intermediate layer is a thin film comprising at least one of amorphous silicon, silicon dioxide, silicon nitride, and alumina.

15. The nanofabrication method according to claim 8, wherein the resist layer is formed by sputtering or evaporation.

16. The nanofabrication method according to claim 15, wherein the sputtering is performed in an oxygen-containing atmosphere with a transition metal target.

17. The nanofabrication method according to claim 8, wherein the transition metal comprises at least one of Ti, V, Cr, Mn, Fe, Nb, Cu, Ni, Co, Mo, Ta, W, Zr, Ru, and Ag.

18. The nanofabrication method of claim 8, wherein the oxygen content of the resist material is only slightly lower than the stoichiometric oxygen content of the completely oxidized transition metal alloy.

19. The nanofabrication method according to claim 8, wherein the transition metal alloy includes tungsten and molybdenum provided in a ratio of approximately 80:20 and the oxidized transition metal alloy includes an oxygen content of approximately 60 atomic percent.

* * * * *